(12) United States Patent
Espiritu et al.

(10) Patent No.: US 7,687,892 B2
(45) Date of Patent: Mar. 30, 2010

(54) QUAD FLAT PACKAGE

(75) Inventors: Emmanuel A. Espiritu, Singapore (SG); Leo A. Merilo, Singapore (SG); Rachel L. Abinan, Singapore (SG); Dario S. Filoteo, Jr., Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 363 days.

(21) Appl. No.: 11/463,072

(22) Filed: Aug. 8, 2006

(65) Prior Publication Data

US 2008/0036051 A1   Feb. 14, 2008

(51) Int. Cl.
*H01L 23/495* (2006.01)
*H01L 21/00* (2006.01)
*H01R 9/00* (2006.01)

(52) U.S. Cl. .................. 257/672; 257/674; 257/692; 257/693; 257/735; 257/E23.031; 257/E23.043; 257/E23.052; 361/772; 361/813; 438/123

(58) Field of Classification Search .................. None
See application file for complete search history.

(56) References Cited

U.S. PATENT DOCUMENTS

| | | | |
|---|---|---|---|
| 5,770,888 A * | 6/1998 | Song et al. | 257/696 |
| 6,080,264 A * | 6/2000 | Ball | 156/292 |
| 6,087,722 A | 7/2000 | Lee et al. | |
| 6,104,084 A | 8/2000 | Ishio et al. | |
| 6,483,181 B2 * | 11/2002 | Chang et al. | 257/686 |
| 6,590,281 B2 * | 7/2003 | Wu et al. | 257/684 |
| 6,603,072 B1 | 8/2003 | Foster et al. | |
| 6,744,121 B2 * | 6/2004 | Chang et al. | 257/668 |
| 7,202,554 B1 * | 4/2007 | Kim et al. | 257/686 |
| 2005/0133916 A1 * | 6/2005 | Karnezos | 257/738 |
| 2006/0022315 A1 | 2/2006 | Huang et al. | |
| 2007/0235217 A1 * | 10/2007 | Workman | 174/260 |

* cited by examiner

*Primary Examiner*—Alonzo Chambliss
(74) *Attorney, Agent, or Firm*—Robert D. Atkins

(57) ABSTRACT

A semiconductor package includes a leadframe having first and second level downset lead extensions, a quad flat nonleaded package (QFN) attached to the first level downset lead extension, and a flip chip die attached to the second level downset lead extension. Another embodiment of a semiconductor package includes a leadframe having a lead, a first quad flat nonleaded package (QFN) connected to the lead, and a second quad flat nonleaded package invertly connected to a top surface of the first quad flat nonleaded package, wherein the second quad flat nonleaded package is wirebonded to the lead. A third embodiment of a semiconductor package includes a leadframe having a lead with a first level downset lead extension, a quad flat nonleaded package (QFN) connected to the first level downset lead extension, and a first wirebondable die attached to a top or bottom surface of the quad flat nonleaded package.

17 Claims, 4 Drawing Sheets

QUAD FLAT PACKAGE

FIELD OF THE INVENTION

The present invention relates in general to semiconductor devices and, more particularly, to multi-chip semiconductor packages that have stacked dies.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As the demand for semiconductor devices with low-cost, high performance, increased miniaturization, and greater packaging densities has increased, Multi-Chip Module (MCM) structures have been developed to meet the demand. MCM structures have a number of dies and other semiconductor components mounted within a single semiconductor package. The number of dies and other components can be mounted in a vertical manner, a lateral manner, or combinations thereof.

One such approach is to stack one die on top of another and then enclose the stack of dies in one package. The final package for a semiconductor with stacked dies is much smaller than would result if the dies were each packaged separately. In addition to providing a smaller size, stacked-die packages offer a number of advantages that relate to the manufacturing of the package, such as ease of handling and assembly.

In a stacked-die arrangement, the dies are wire-bonded sequentially, typically with automated wire-bonding equipment employing well-known thermal compression or ultrasonic wire-bonding techniques. During the wire-bonding process, the head of a wire-bonding apparatus applies a downward pressure on a conductive wire held in contact with a wire-bonding pad on the die to weld, or bond, the wire to the bonding pad on the die.

In many cases, stacked-die semiconductors can be fabricated faster and more cheaply than several semiconductors, each having a single die, which perform the same functions. A stacked-die approach is advantageous because of the increase in circuit density achieved.

A variety of semiconductor package configurations having stacked die arrangements are found in the art. However, the configurations fail to utilize a known quad flat nonleaded package (QFN) which is incorporated with a flipchip die and/or a wirebondable die into a quad flat package (QFP).

Accordingly, a need exists for a QFP utilizing a known QFN package, a flipchip die and/or a wirebondable die to provide cost efficiency, the QFP having the previously described configurability.

SUMMARY OF THE INVENTION

In one embodiment, the present invention is a semiconductor package, comprising a leadframe having first and second level downset lead extensions, a quad flat nonleaded package (QFN) attached to the first level downset lead extension, and a flip chip die attached to the second level downset lead extension.

In another embodiment, the present invention is a semiconductor package, comprising a leadframe having a lead, a first quad flat nonleaded package (QFN) connected to the lead, and a second quad flat nonleaded package invertly connected to a top surface of the first quad flat nonleaded package, wherein the second quad flat nonleaded package is wirebonded to the lead.

In another embodiment, the present invention is a semiconductor package, comprising a leadframe having a lead with a first level downset lead extension, a quad flat nonleaded package (QFN) connected to the first level downset lead extension, and a first wirebondable die attached to a top or bottom surface of the quad flat nonleaded package.

In still another embodiment, the present invention is a method of manufacturing a semiconductor package, comprising providing a leadframe having first and second level downset lead extensions, connecting a quad flat nonleaded package (QFN) to the first level downset lead extensions, and connecting a flip chip die attached to the second level downset lead extension.

BRIEF DESCRIPTION OF THE DRAWINGS

FIG. 3b illustrates a first lead type which is compatible with the embodiment shown in FIG. 3a;

FIG. 3c illustrates a second lead type which is compatible with the embodiment shown in FIG. 3a;

FIG. 3d illustrates a third lead type which is compatible with the embodiment shown in FIG. 3a;

FIG. 4b illustrates a first lead type which is compatible with the embodiment shown in FIG. 4a;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor package can be manufactured which takes into account a stacked-die arrangement and serves to alleviate many of the problems previously described, while providing increasingly smaller sizes. The package can be manufactured more easily and with greater efficiency than previous packages, resulting in a package with lower overall manufacturing cost.

The semiconductor packages described below reduce incidences of upper die cracking during wire bonding of the upper die, which provides additional freedom in the design and location of various sized dies in semiconductor packages having stacked dies. Additionally, the packages alleviate problems associated with heat dissipation in semiconductor packages having multiple dies, which allows more dies to be placed in a given semiconductor package.

The semiconductor packages described serve to reduce the amount of adhesive material used when multiple dies are stacked, resulting in a reduction in the amount of moisture that can be absorbed into the package. Finally, the reliability of semiconductor packages having stacked dies is increased by use of the following designs and methods of manufacture.

Figure 1A:
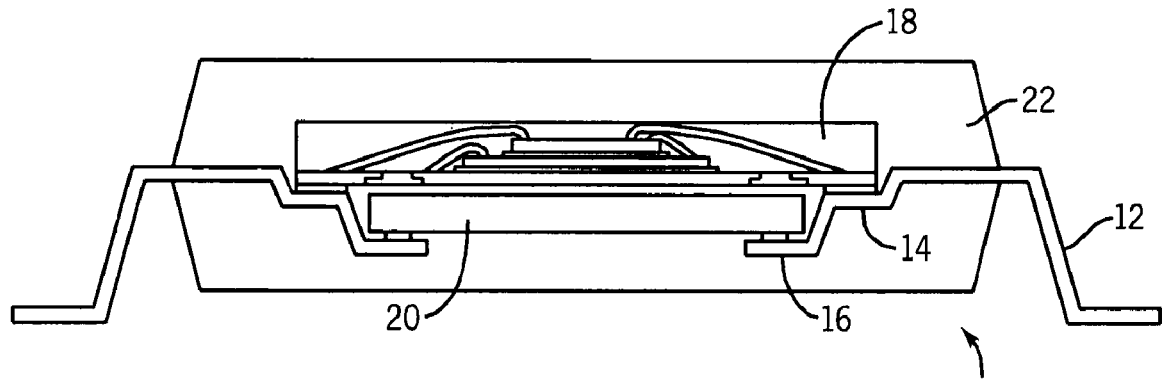
FIG. 1a illustrates an example embodiment of a standard quad flat package (QFP) having an incorporated quad flat nonleaded package (QFN) and flip chip semiconductor die.
Figure 1B:
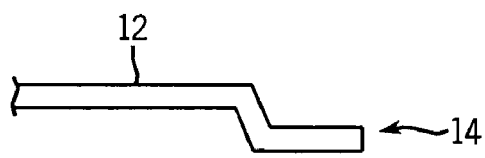
FIG. 1b illustrates a lead having a first level downset lead extension.
Figure 1C:
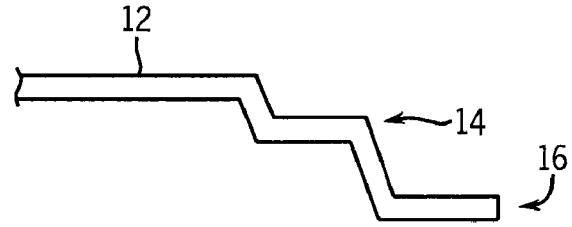
FIG. 1c illustrates a lead having first and second level downset lead extensions.

Turning to FIG. 1a, a first example embodiment of a semiconductor package 10 with a stacked-die arrangement is illustrated. Package 10 consists of a standard quad flat package (QFP) 10. QFP package 10 includes a leadframe 12. Connected to leadframe 12 are leads having downset lead extensions. A double downset lead extension structure is depicted. A first level downset lead extension 14 is connected to a second level downset lead extension 16. A quad flat non-leaded package (QFN) 18 is attached on the first level downset extension 14. A flip chip semiconductor die 20 is shown attached to the second level downset extension 16. The location of die 20 and QFN 18 can be interchanged to suit a particular application. Moreover, the QFP can include a plurality of two or more QFN packages 18, or a plurality of any combination of QFN packages 18 and dies 20. Package 10 can vary in size to accommodate the various number of subcomponent packages 18 and/or dies 20. Additional level downset extensions are contemplated to accommodate additional packages 18 and/or dies 20.

An encapsulant 22 is formed over QFN 18, die 20, and at least a portion of the first and second level downset extensions 14, 16 to provide structural support, resulting in the completed QFP 10. The manufacturing techniques involving encapsulant 22 can include those generally known in the art and selected for a particular application.

Downset leads 14, 16 incorporated into QFP 10 can perform a variety of functions, including serving to control the overall stack height positioning inside the QFP 10, and to control the position of the QFN 18 and die 20 in place, particularly during the attachment process, by limiting the movement of QFNs 18 and dies 20.

Figure 2:
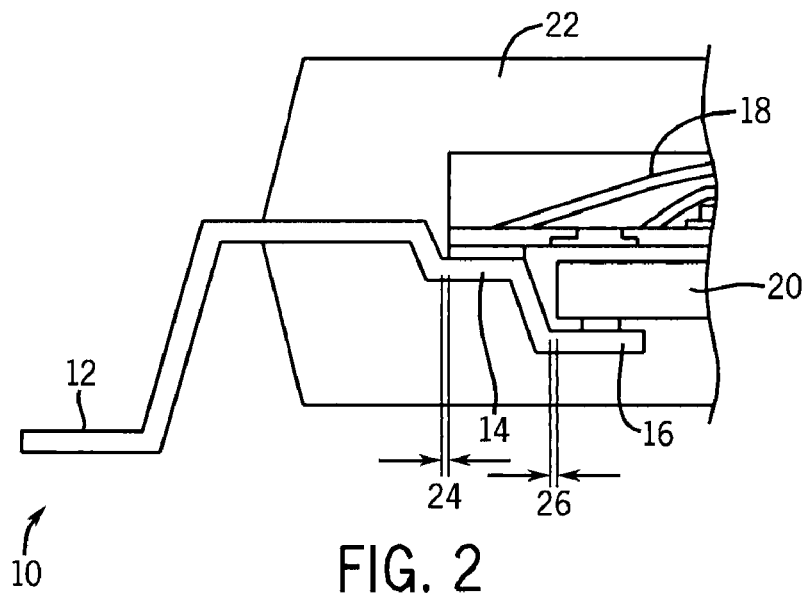
FIG. 2 illustrates example dimensions of a quad flat package having first and second downset lead extensions.

Turning to FIG. 2, an illustration of example width dimensions of QFP 10 is depicted. Again, leadframe 12, lead extensions 14, 16, QFNs 18, dies 20, and encapsulant 22 are again depicted. Widths 24 and 26 are shown, which essentially constitute the gap between a vertical surface of QFN 18 and/or die 20 and a vertical surface of lead extensions 14, 16. The configuration of lead extensions 14, 16 allows for the minimization of widths 24, 26, leading to limited movement of QFN 18 and/or die 20. The limited movement results in increased control of positioning of QFN 18 and/or die 20 along the horizontal axis during the attachment process.

QFN 18 can consist of any package variation known in the art. QFN 18 can include either an exposed or non-exposed wire bond pad. Example QFN packages include flip chip quad flat nonleaded packages (fcQFN) and/or wirebonded QFNs in a single or stacked die arrangement, bump chip carriers (BCCs), punch singulated QFNs (LFCSP), and SON packages. QFN 18 can be attached using any conductive adhesive material, such as solder paste, solder or epoxy.

The foregoing semiconductor package 10 can be fabricated by a method comprising the steps of: preparing a leadframe 12 having downset extensions 14, 16, preparing a QFN package 18 and flip chip semiconductor die 20, attaching the QFN 18 and die 20 to the extensions 14, 16 to electrically interconnect the QFN 18 and die 20 to the leadframe 12, and finally, forming an encapsulant 22 to encapsulate the package 10 including the QFN 18, die 20 and at least a portion of the downset extensions 14, 16 to provide structural support.

Figure 3A:
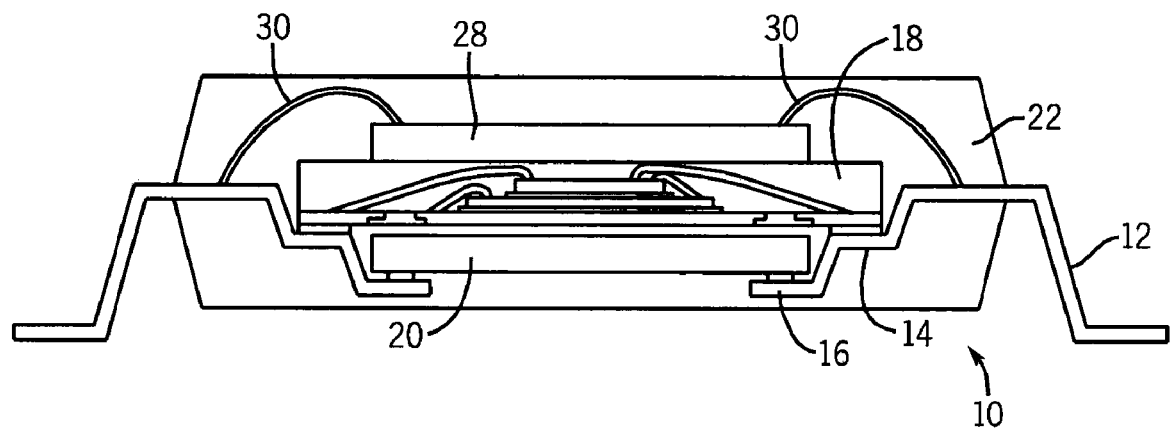
FIG. 3a illustrates a second example embodiment of a QFP having an additional semiconductor die attached on a top surface of the QFN package.

Turning to FIG. 3a, a second example embodiment of a QFP 10 is depicted. QFP 10 again includes leadframe 12, downset extensions 14, 16, a QFN package 18, and a flip chip die 20. Again, encapsulant 22 is shown providing structural support. In addition to the foregoing structures, an additional wirebondable semiconductor die 28 is shown disposed on top of QFN 18. Die 28 is shown wirebonded to the QFP leads 12.

Figure 3B:
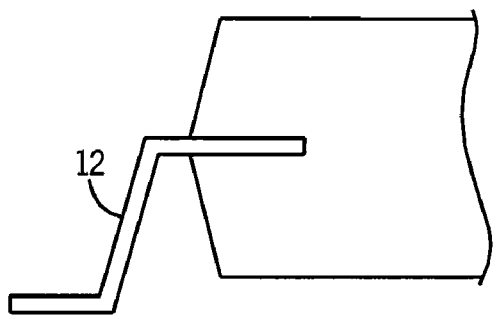
Figure 3C:
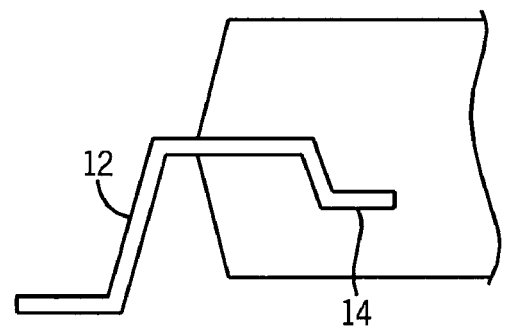
Figure 3D:
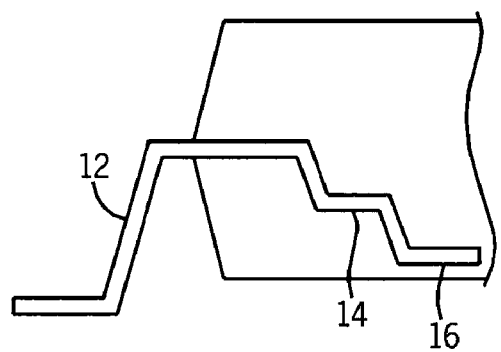

Die 28 can be attached by any adhesive material (tape or epoxy). Additionally, the adhesive material can be either a conductive or non-conductive material. Three types of lead structures can be used in the package 10 as depicted. FIGS. 3b, 3c, and 3d depict three types of lead structures, FIG. 3c having a first level downset lead extension 14 and FIG. 3d having first and second level downset lead extensions 14, 16. Each of the lead types depicted in FIGS. 3b, 3c, and 3d can be wirebonded to die 28.

Figure 4A:
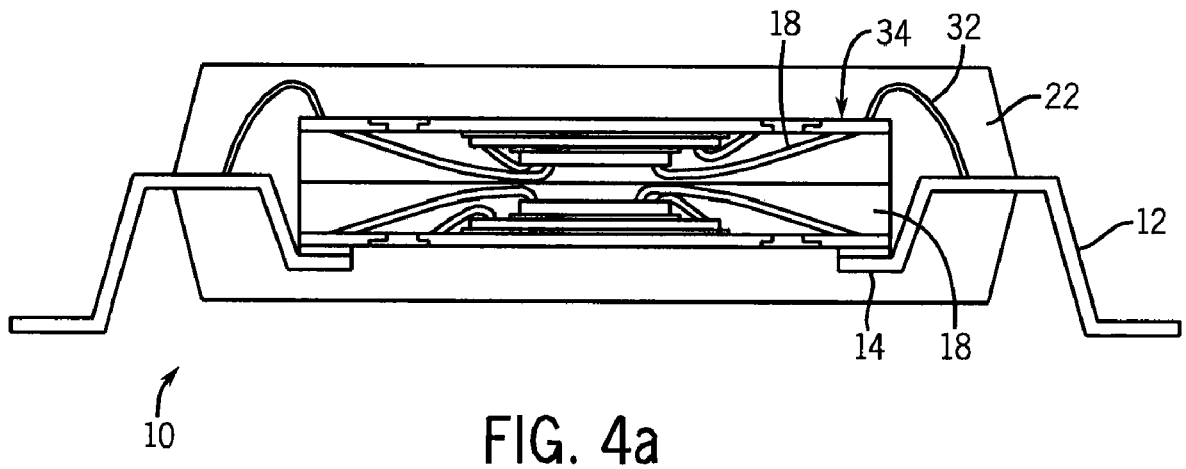
FIG. 4a illustrates a third example embodiment of a QFP having two integrated QFN packages.
Figure 4B:
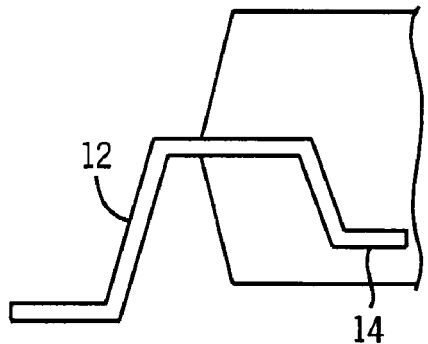
Figure 4C:
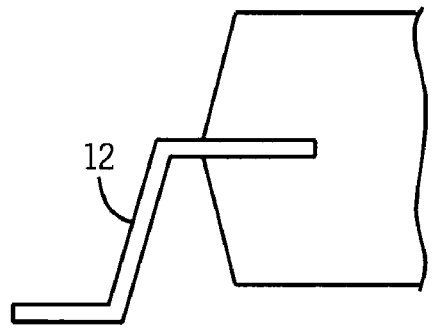
FIG. 4c illustrates a second lead type which is compatible with the embodiment shown in FIG. 4b.

Turning to FIG. 4a, a third example embodiment of a package 10 is shown. Package 10 again includes a standard QFN package with two incorporated QFN packages 18. The first, lower QFN package 18 is attached on top of the downset lead extensions 14. The second, upper QFN 18 is inverted, then attached to a top surface of the first QFN 18. The second, top QFN 18 is then wirebonded to the QFP leads 12. The top QFN 18 can be attached by any adhesive (film or epoxy) and can consist of conductive or non-conductive materials. FIGS. 4b and 4c depict two types of leads 12 which can be used with the depicted QFP 10 as shown in FIG. 4a. Additionally, the types of lead structures 12 depicted in FIGS. 4b and 4c can be used with the embodiments depicted in FIGS. 5, 6a, 6b and 6c, following.

Figure 5:
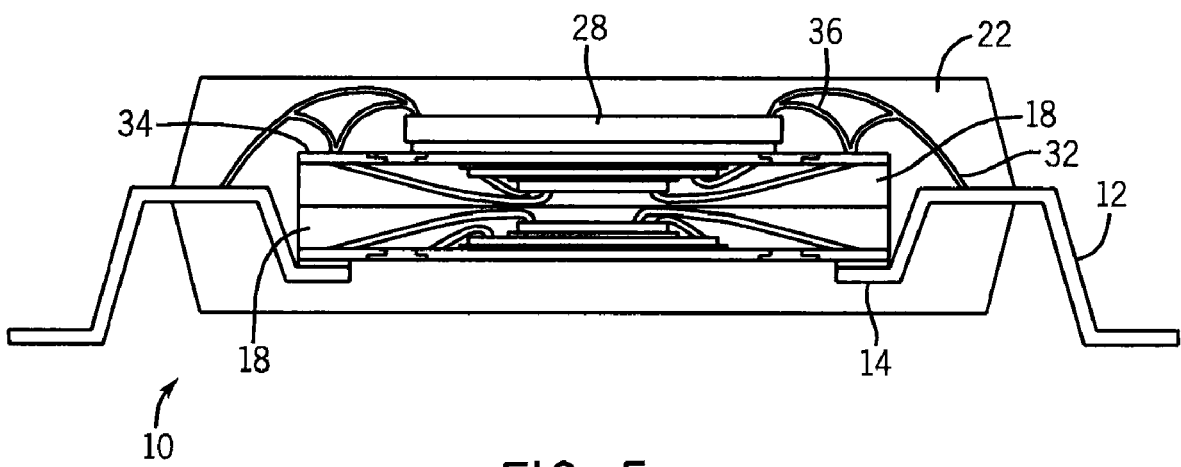
FIG. 5 illustrates a fourth example embodiment of a QFP having two integrated QFN packages and an additional semiconductor die.

FIG. 5 depicts a fourth example embodiment of a QFP 10. QFP 10 includes an additional wirebondable semiconductor die 28 which is attached on a top surface of the inverted QFN 18. The die 28 is then wirebonded to the leads 12 with wires 32. Die 28 is also wire bonded between wire bond pads 34 on top QFN 18 and leads 12 using wires 36 as depicted. Die 28, again, can attach to top QFN 18 by any adhesive material (tape or epoxy) and either a conductive or non-conductive material.

Figure 6A:
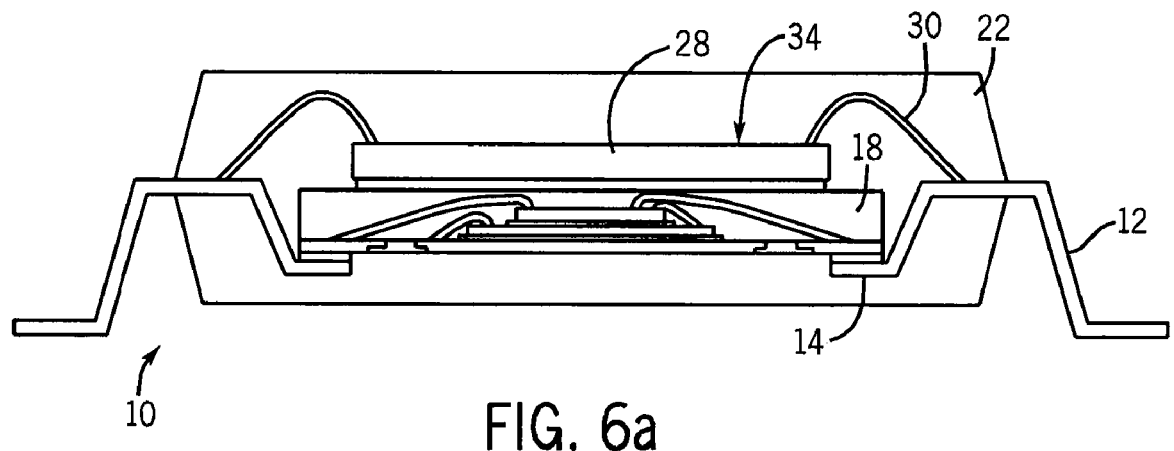
FIG. 6a illustrates a fifth example embodiment of a QFP having an integrated QFN package and a wirebonded semiconductor die attached to a top surface of the QFN package.

FIG. 6a depicts a fifth example embodiment of a QFP 10. In the depicted example, QFP 10 includes a standard QFP package 10 having a QFN 18 attached on top of the downsetted lead extensions 14. A wirebondable semiconductor die 28 is attached on top of the QFN 18. The die 28 is then wire bonded using wire 30 between leads 12 and wire bond pad 34 to provide electrical connectivity. Here, as before, the first level downset lead extension 14 provides for limited movement of the QFN package 18 and/or die 28 during the attachment process for better position control along the horizontal axis. Additionally, the use of extension 14 allows control over the overall stack height position inside the QFP 10.

Figure 6B:
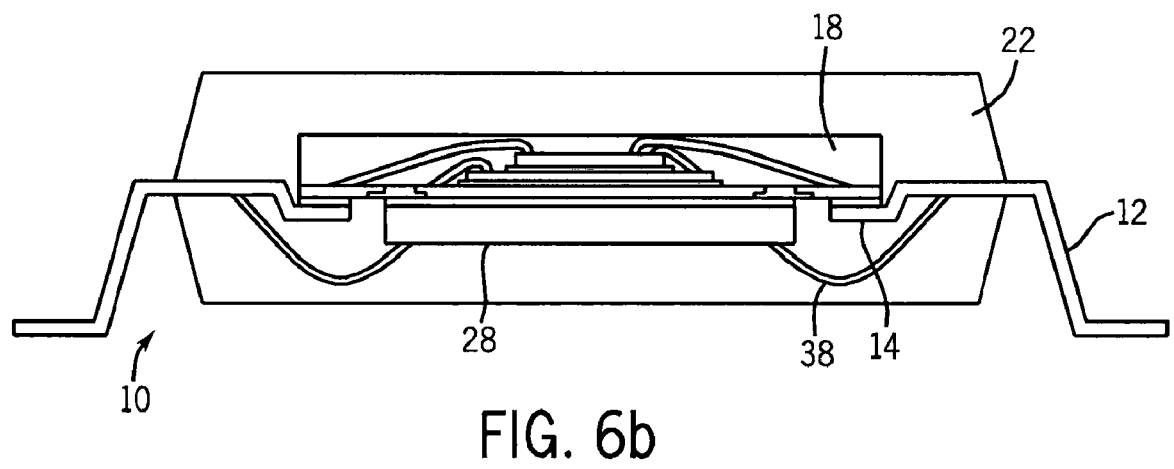
FIG. 6b illustrates a sixth example embodiment of a QFP having an integrated QFN package and a wirebonded semiconductor die attached to a bottom surface of the QFN package.

FIG. 6b illustrates a sixth example embodiment of a QFP 10. Again, package 10 is a standard QFP 10 having an integrated QFN 18 package attached on top of the downsetted lead extensions 14. A wirebondable semiconductor die 28 is attached on the bottom of the QFN 18 package. The die 28 is then wirebonded to the leads 12 using wires 38.

Figure 6C:
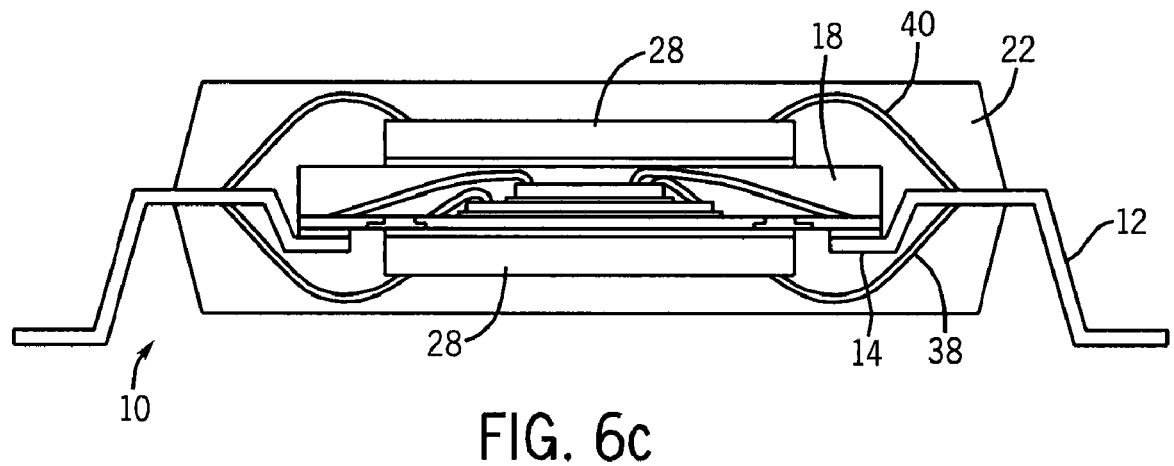
FIG. 6c illustrates a seventh example embodiment of a QFP having an integrated QFN package and a wirebonded semiconductor die attached to a top and bottom surface of the QFN package.

FIG. 6c illustrates a seventh example embodiment of a QFP 10. Package 10 again consists of a standard QFP 10 having an integrated QFN 18 package which is attached on top of the downsetted lead extensions 14. Two semiconductor dies 28 are attached on a top and a bottom surface of QFN 18. The bottom die 28 is attached to leads 12 using wires 38. The top die 28 is attached to leads 12 using wires 40.

The use of package 10 as described involves new stacking concepts suitable for a QFP package. As the cost of leaded packages is much lower than the costs associated with an array package, the use of package 10 is less expensive, yet the needs for higher functionality and device density of new generation packages are not compromised.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor package, comprising:
a leadframe having a horizontal surface and first and second level downset lead extensions, the first level downset lead extension having a vertical surface extending from the horizontal surface of the leadframe, the first level downset lead extension further having a horizontal surface extending from the vertical surface of the first level downset lead extension, the horizontal surface of the first level downset lead extension being vertically offset from the horizontal surface of the leadframe, the second level downset lead extension having a vertical surface extending from the horizontal surface of the first level downset lead extension, the second level downset lead extension further having a horizontal surface extending from the vertical surface of the second level downset lead extension, the horizontal surface of the second level downset lead extension being vertically offset from the horizontal surface of the first level downset lead extension;
a quad flat nonleaded package (QFN) attached to the horizontal surface of the first level downset lead extension with solder, the QFN being positioned within a gap of the vertical surface of the first level downset lead extension to limit movement of the QFN during stacking; and
a flip chip die attached to the horizontal surface of the second level downset lead extension with solder, the flip chip die being positioned within a gap of the vertical surface of the second level downset lead extension to limit movement of the flip chip die during stacking.

2. The semiconductor package of claim 1, further including an encapsulant formed over the QFN for providing structural support to the QFN within the semiconductor package.

3. The semiconductor package of claim 1, further including a wirebondable die attached to a top surface of the QFN.

4. The semiconductor package of claim 3, wherein the wirebondable die is attached by an adhesive material.

5. The semiconductor package of claim 4, wherein the adhesive material is conductive or nonconductive.

6. A semiconductor device, comprising:
a leadframe having a horizontal surface and first and second level downset lead extensions, the first level downset lead extension having a vertical surface extending from the horizontal surface of the leadframe, the first level downset lead extension further having a horizontal surface extending from the vertical surface of the first level downset lead extension, the horizontal surface of the first level downset lead extension being vertically offset from the horizontal surface of the leadframe, the second level downset lead extension having a vertical surface extending from the horizontal surface of the first level downset lead extension, the second level downset lead extension further having a horizontal surface extending from the vertical surface of the second level downset lead extension with solder, the horizontal surface of the second level downset lead extension being vertically offset from the horizontal surface of the first level downset lead extension;
a first leadless semiconductor die attached to the horizontal surface of the first level downset lead extension with solder, the first leadless semiconductor die being positioned within a gap of the vertical surface of the first level downset lead extension to limit movement of the first leadless semiconductor die during stacking, wherein the first leadless semiconductor die is a quad flat nonleaded package; and
a second leadless semiconductor die attached to the horizontal surface of the second level downset lead extension, the second leadless semiconductor die being positioned within a gap of the vertical surface of the second level downset lead extension to limit movement of the second leadless semiconductor die during stacking.

7. The semiconductor device of claim 6, further including an encapsulant formed over the first and second leadless semiconductor die for providing structural support.

8. The semiconductor device of claim 6, further including a first wirebondable die attached to a first surface of the first leadless semiconductor die.

9. The semiconductor device of claim 8, wherein the first wirebondable die is attached by an adhesive material.

10. The semiconductor device of claim 9, wherein the adhesive material is conductive or non conductive.

11. The semiconductor device of claim 6, wherein the second semiconductor die is a flip chip die.

12. A semiconductor device, comprising:
a leadframe having a horizontal surface and first and second level downset lead extensions, the first level downset lead extension having a vertical surface extending from the horizontal surface of the leadframe, the first level downset lead extension further having a horizontal surface extending from the vertical surface of the first level downset lead extension, the horizontal surface of the first level downset lead extension being vertically offset from the horizontal surface of the leadframe, the second level downset lead extension having a vertical surface extending from the horizontal surface of the first level downset lead extension, the second level downset lead extension further having a horizontal surface extending from the vertical surface of the second level downset lead extension, the horizontal surface of the second level downset lead extension being vertically offset from the horizontal surface of the first level downset lead extension;

a first semiconductor die or package attached to the horizontal surface of the first level downset lead extension, the first semiconductor die or package being positioned within a gap of the vertical surface of the first level downset lead extension to limit movement of the first semiconductor die or package during stacking, wherein the first semiconductor die or package is a quad flat nonleaded package; and a second semiconductor die or package attached to the horizontal surface of the second level downset lead extension, the second semiconductor die or package being positioned within a gap of the vertical surface of the second level downset lead extension to limit movement of the second semiconductor die or package during stacking.

13. The semiconductor device of claim 12, further including an encapsulant formed over the first and second semiconductor die or package for providing structural support.

14. The semiconductor device of claim 12, further including a third semiconductor die or package attached to a first surface of the first semiconductor die or package.

15. The semiconductor device of claim 14, wherein the third semiconductor die or package is attached by an adhesive material.

16. The semiconductor device of claim 15, wherein the adhesive material is conductive or non conductive.

17. The semiconductor device of claim 12, wherein the second semiconductor die or package is a flip chip die.

* * * * *